United States Patent
Sato

(10) Patent No.: US 7,260,123 B2
(45) Date of Patent: Aug. 21, 2007

(54) SEMICONDUCTOR LIGHT-EMITTING APPARATUS HAVING WAVELENGTH CONVERSION PORTION AND METHOD OF FABRICATING THE SAME

(75) Inventor: Hiroyuki Sato, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 160 days.

(21) Appl. No.: 11/013,362

(22) Filed: Dec. 17, 2004

(65) Prior Publication Data

US 2005/0139851 A1    Jun. 30, 2005

(30) Foreign Application Priority Data

Dec. 26, 2003  (JP)  ............... 2003-433351

(51) Int. Cl.
*H01S 3/10* (2006.01)
*H01L 27/15* (2006.01)

(52) U.S. Cl. .................................. 372/22; 257/79
(58) Field of Classification Search ................ 372/22; 257/79
See application file for complete search history.

(56) References Cited

U.S. PATENT DOCUMENTS

| 6,066,861 | A   | 5/2000  | Hohn et al.  | 257/99 |
| 6,576,930 | B2  | 6/2003  | Reeh et al.  | 257/98 |
| 6,592,780 | B2  | 7/2003  | Hohn et al.  | 252/301.36 |
| 6,613,247 | B1  | 9/2003  | Hohn et al.  | 252/301.36 |
| 6,669,866 | B1  | 12/2003 | Kummer et al. | 252/301.4 R |
| 6,774,401 | B2  | 8/2004  | Nakada et al. | 257/82 |
| 6,809,342 | B2* | 10/2004 | Harada        | 257/79 |
| 6,812,500 | B2  | 11/2004 | Reeh et al.   | 257/98 |

FOREIGN PATENT DOCUMENTS

| JP | 10-190065    | 12/1996 |
| JP | 2001-127346  | 10/1999 |
| JP | 2001-196639  | 1/2000  |
| JP | 2001-210872  | 1/2000  |
| JP | 2001-345483  | 5/2000  |
| JP | 2004-056075  | 12/2002 |

* cited by examiner

*Primary Examiner*—Armando Rodriguez
(74) *Attorney, Agent, or Firm*—Cermak Kenealy & Vaidya, LLP

(57) ABSTRACT

A semiconductor light-emitting apparatus which has a simple structure can include a base having a concave portion having an upward opening, a semiconductor light-emitting device placed on the bottom of the concave portion, and a wavelength conversion portion for converting the wavelength of light emitted from the semiconductor light-emitting device. The wavelength conversion portion can include first and second wavelength conversion layers formed on the bottom of the concave portion and in the opening thereof at a distance above the device, respectively. A space defined by the base having the concave portion and the second wavelength conversion layer can be provided with a sealing portion containing a material for transmitting the light emitted from the semiconductor device and light that is emitted from the first and second wavelength conversion layers.

18 Claims, 8 Drawing Sheets

→ :Excitation light
←- - :Wavelength converted light (A)

(B)

(C)

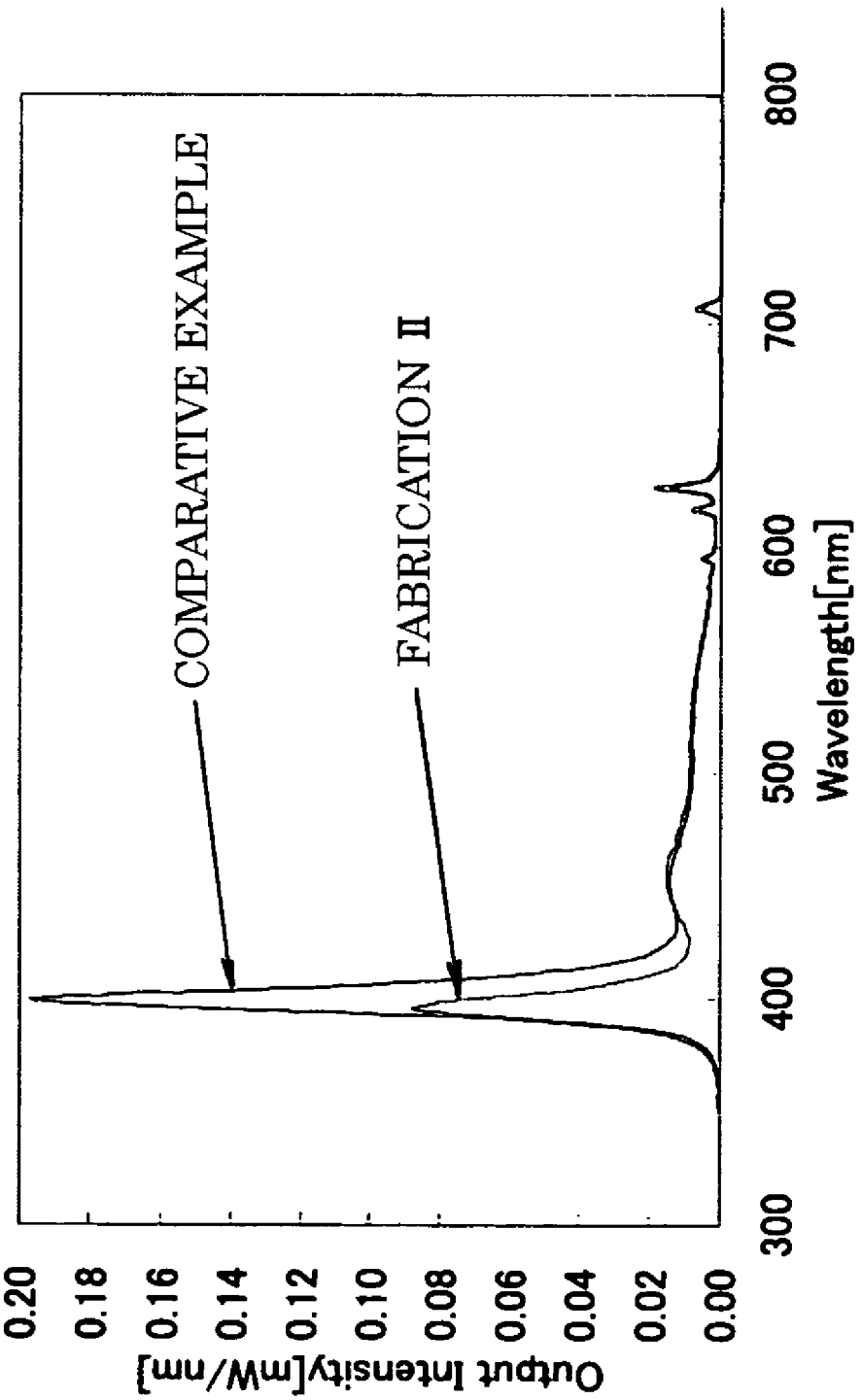

US 7,260,123 B2

SEMICONDUCTOR LIGHT-EMITTING APPARATUS HAVING WAVELENGTH CONVERSION PORTION AND METHOD OF FABRICATING THE SAME

This application claims the priority benefit under 35 U.S.C. §119 of Japanese Patent Application No. 2003-433351 filed on Dec. 26, 2003, which is hereby incorporated by reference.

BACKGROUND OF THE INVENTION

1. Field of the Invention

The present invention relates to a light-emitting apparatus having a semiconductor light-emitting device. In particular, the invention relates to a semiconductor light-emitting apparatus in which a semiconductor light-emitting device, or excitation light source, and a wavelength conversion portion are combined to chiefly emit white light.

2. Description of the Related Art

FIG. 1 shows a known light-emitting apparatus that uses a wavelength conversion material. This light-emitting apparatus can include an insulating base 10, a semiconductor light-emitting device 12, and a light transmitting substrate 16 which is arranged on the insulating base 10. A pair of lead electrodes 11 can be formed on the surface of a substrate under the insulating base 10. The insulating base 10 can also have a concave portion 13 and a curved portion 14. The semiconductor light-emitting device 12 can be placed at the center of the bottom of the concave portion 13. The curved portion 14 can be continuous to the periphery of the concave portion 13. The semiconductor light-emitting device 12 placed at the center of the bottom of the concave portion 13 can be electrically connected with the pair of lead electrodes 11. A wavelength conversion layer 15 can be formed on a surface of the light transmitting substrate 16 where it faces the base 10.

For the sake of efficient light reflection, a reflecting film 17 made of Ag or the like can be formed on the inside of the concave portion 13 and the surface of the curved portion 14. The wavelength conversion layer 15 can be made of a resin in which phosphor materials are dispersed. The phosphor materials can be configured/selected for emitting light when excited by excitation light emitted from the semiconductor light-emitting device 12. The wavelength conversion layer 15 can be formed on the light transmitting substrate 16 by such means as screen printing. The light transmitting substrate 16 can be placed so that the wavelength conversion layer 15 is opposed to the semiconductor light-emitting device 12 and can be situated substantially directly above the concave portion 13 accommodating the device 12. The base 10 having the concave portion 13 and the curved portion 14 can, in conjunction with the light transmitting substrate 16 provided with the wavelength conversion layer 15, define a space which is filled with a translucent sealing material 18 to seal the semiconductor light-emitting device 12 and the wavelength conversion layer 15. Incidentally, the reflecting film 17 on the curved portion 14 may be coated with a second wavelength conversion layer 19 (for example, see Japanese Unexamined Patent Application Publication No. 2004-56075 A or its corresponding U.S. Pat. No. 6,809,342).

In the light-emitting apparatus described above, the concave portion 13 for accommodating the semiconductor light-emitting device and the curved portion 14 can and often should be formed for the sake of improved light emission efficiency. Suppose, for example, the light-emitting apparatus of this configuration is applied in a white chip LED (a surface mountable LED device emitting light in the white wavelength range) or the like for use in a liquid crystal display backlight of a cellular phone or mobile information terminal. The mold for forming the base 10 having the concave portion 13 and the curved portion 14 can and often should have a high degree of precision, and thus may require extremely high skill for fabrication. As a result, there have been problems relating to increased costs for the white chip LED, difficulty in manufacturing, etc.

With an extremely simple configuration in which the first wavelength conversion layer 15 is formed alone without the curved portion 14 or the second wavelength conversion layer 19, the light-emitting apparatus can develop unevenness in color inside. A reason for this is as follows: When the light-emitting apparatus is viewed from its optical axis, the color of the excitation light is dominant in an area immediately near the semiconductor light-emitting device 12. Meanwhile, the color complementary to that of the excitation light, occurring from the wavelength conversion layer, is dominant in surrounding areas somewhat away from the area immediately near the semiconductor light-emitting device 12. In terms of intensity (intensity distribution), there have been problems in that the intensity peaks at the area immediately near the semiconductor light-emitting device 12 and it decreases toward the periphery.

Next, we will analyze the case where the base 10 is provided with the concave portion 13 alone without the curved portion 14, and only the second wavelength conversion layer 19 is formed on the inside of the concave portion 13 without the first wavelength conversion layer 15. Here, when the light-emitting apparatus is viewed from its optical axis, the light of the semiconductor light-emitting device 12 has difficulty in reaching the second wavelength conversion layer 19. Consequently, the complementary color of the excitation light, i.e., the light from the wavelength conversion layer 19 is dominant in the area immediately near the wavelength conversion layer 19 while the color of the light emitted from the semiconductor light-emitting device 12 is dominant in the other areas. That is, unevenness in color has also occurred in this case. As for intensity distribution, there have also been problems similar to the intensity problems described above.

SUMMARY OF THE INVENTION

To solve the foregoing and other related problems, intensive studies have been made to obtain equivalent or better properties from light emitting devices. As a result, the above and/or other problems can be solved or mediated by the provision of different embodiments of the invention.

According to an aspect of the invention, a semiconductor light-emitting apparatus can include a base having a concave portion with a bottom and an upward opening, and a pair of electrodes located adjacent the bottom of the concave portion. A semiconductor light-emitting device can be placed on the bottom of the concave portion, being electrically bonded with the pair of electrodes. A wavelength conversion portion can be provided for converting the wavelength of light emitted from the semiconductor light-emitting device. The wavelength conversion portion can be composed of a first wavelength conversion layer formed adjacent the bottom of the concave portion, and a second wavelength conversion layer formed in the opening of the concave portion at a distance above the semiconductor light-emitting device. A space defined by the base having the concave portion and the second wavelength conversion layer can be provided with a sealing portion containing a material for substantially transmitting the light emitted from the semiconductor light-emitting device and wavelength conversion light emitted from the first and second wavelength conversion layers.

In the semiconductor light-emitting apparatus having the foregoing configuration, a top surface of the sealing portion corresponding to a location directly above the semiconductor light-emitting device is preferably formed as a generally recessed surface recessed toward the semiconductor light-emitting device.

At least one of the first wavelength conversion layer and the second wavelength conversion layer can contain at least one type of phosphor selected from the group that includes or consists of phosphors having the composition of $A_3B_5O_{12}:M$ (A: at least one element selected from among Y, Gd, Lu, and Tb; B: at least one element selected from between Al and Ga; and M: at least one ion selected from among $Ce^{3+}$, $Tb^{3+}$, $Eu^{3+}$, $Cr^{3+}$, $Nd^{3+}$, and $Er^{3+}$), rare-earth doped barium-aluminum-magnesium compound phosphors, sulfide compound phosphors, rare-earth doped thiogallate phosphors, and aluminate phosphors.

The material for forming the sealing portion can contain at least one resin selected from the group that includes and/or consists of epoxy resins, silicone resins, polydimethylsiloxane derivatives having epoxy groups, oxetane resins, acryl resins, and cycloolefin resins.

The second wavelength conversion layer may be formed to cover the entire opening of the concave portion.

The first wavelength conversion layer may also be formed on the top surface of the semiconductor light-emitting device placed on the bottom of the concave portion.

According to another aspect of the invention, there can be provided a method of fabricating a semiconductor light-emitting apparatus that includes the following: providing a base having a concave portion with a bottom, and being provided with a pair of electrodes; providing a semiconductor light-emitting device placed on the bottom of the concave portion, and being electrically bonded with the pair of electrodes; providing a wavelength conversion portion for converting the wavelength of light emitted from the semiconductor light-emitting device; and providing a sealing portion for sealing the concave portion. The method can include loading the semiconductor light-emitting device onto the center of the concave portion of the base so as to be electrically bonded with the pair of electrodes and forming a first wavelength conversion layer configured to perform as the wavelength conversion portion on the bottom of the concave portion. The method can also include injecting a constituent material of the sealing portion for sealing the concave portion into the concave portion, hardening the constituent material of the sealing portion to form the sealing portion, and forming a second wavelength conversion layer configured to perform as the wavelength conversion portion on the sealing portion hardened.

In this embodiment of the method, it may be preferable that in the forming of the first wavelength conversion layer, a wavelength conversion material be applied to the bottom of the concave portion to form the first wavelength conversion layer.

It is also preferable in some instances in the forming of the first wavelength conversion layer, that a wavelength-conversion-material-containing sheet that has a predetermined thickness and a wavelength conversion material at a predetermined density be placed on the concave portion to form the first wavelength conversion layer.

According to a further aspect of the invention, there can be provided a method of fabricating a semiconductor light-emitting apparatus that includes: providing a base having a concave portion with a bottom, and being provided with a pair of electrodes; providing a semiconductor light-emitting device placed on the bottom of the concave portion, and being electrically bonded with the pair of electrodes; providing a wavelength conversion portion for converting the wavelength of light emitted from the semiconductor light-emitting device; and providing a sealing portion for sealing the concave portion. The method can include loading the semiconductor light-emitting device onto the center of the concave portion of the base so as to be electrically bonded with the pair of electrodes, injecting a mixed material that is obtained by mixing a material for forming the sealing portion and a wavelength conversion material for forming the wavelength conversion portion into the concave portion, densifying the wavelength conversion material in a bottom area of the concave portion so that the part of the bottom area of the concave portion where the wavelength conversion material is densified creates a first wavelength conversion layer configured to perform as the wavelength conversion portion, forming the sealing portion by hardening the mixed material in the concave portion where the first wavelength conversion layer is formed, and forming a second wavelength conversion layer configured to perform as the wavelength conversion portion on the sealing portion hardened.

In the method described above, it is sometimes preferable that in the forming of the first wavelength conversion layer, the wavelength conversion material settle out by its own weight so that the wavelength conversion material is densified in the bottom area of the concave portion.

In yet another aspect of the invention, the semiconductor light-emitting device, or the excitation light source of the wavelength conversion layer, can emit light having a first wavelength (hereinafter, referred to as "basic wavelength light") when a current is applied thereto. The basic wavelength light emitted from this device can reach the first or second wavelength conversion layer.

Part of the basic wavelength light reaching the second wavelength conversion layer can be converted into light having a longer wavelength (hereinafter, referred to as "once-wavelength-converted light") while passing through the second wavelength conversion layer. The once-wavelength-converted light can then be emitted out of the light-emitting apparatus. In view of the characteristics of wavelength conversion layers, the basic wavelength light reaching the second wavelength conversion layer does not entirely experience wavelength conversion. Some of the basic wavelength light is simply scattered without wavelength conversion. Some is emitted to the interior of the light-emitting apparatus with wavelength conversion. The basic wavelength light and/or the once-wavelength-converted light which are scattered and/or emitted to the interior of the light-emitting apparatus reach the first wavelength conversion layer formed on the bottom of the base. Then, they are converted in wavelength into the once-wavelength-converted light and/or light having a further converted wavelength (hereinafter, referred to as "twice-wavelength-converted light") before being emitted out of the light-emitting apparatus.

In the meantime, the basic wavelength light emitted from the semiconductor light-emitting device that reaches the first wavelength conversion layer can be converted at least in part into the once-wavelength-converted light when reflected or scattered. The resultant light travels toward the opening of the concave portion. Subsequently, some of the light may be emitted out of the light-emitting apparatus, some transmitted through the second wavelength conversion layer with wavelength conversion, and some reflected or scattered.

As described above, other aspects of the invention provide suitable methods for fabricating the semiconductor light-emitting apparatus that have wavelength conversion layers. In accordance with these particular aspects of the invention, it is possible to fabricate a semiconductor light-emitting apparatus of low profile with great ease and/or at low cost.

In accordance with another aspect of the invention, it is possible to obtain light emission with significantly high efficiency as compared to apparatuses that utilize only the light transmitted through a wavelength conversion layer or only the light reflected from a wavelength conversion layer. Moreover, since the process of forming a curved area in the concave portion may not be required, a low-profile apparatus can be fabricated at low cost. In addition, light-emitting apparatuses of this type can be manufactured by using conventional LED lead frames as is, which can eliminate the need for special molds.

In accordance with another aspect, the excitation light that is emitted in every direction from the semiconductor light-emitting device can generally undergo sufficient wavelength conversion before being emitted out of the light-emitting apparatus. This means a significant improvement to reducing color unevenness and intensity unevenness. In particular, when near-ultraviolet light is used as the excitation light source, the configuration capable of reducing intensity unevenness and suppressing the transmission of the near-ultraviolet light can prevent a light guide plate and the like from ultraviolet degradation. Moreover, when constituent light sources of white light, such as blue light, are used as the excitation light source, it is possible to fabricate a white LED of reduced color unevenness and intensity unevenness.

BRIEF DESCRIPTION OF THE DRAWINGS

These and other objects, features, and advantages of the present invention will become clear from the following description of exemplary embodiments and with reference to the accompanying drawings, wherein:

FIG. 2A is a sectional view taken along the line IIA-IIA of FIG. 2B, FIG. 2B is a schematic plan view, and FIG. 2C is a sectional view taken along the line IIC-IIC of FIG. 2B;

FIG. 5A is a sectional view of the same, and FIG. 5B is a plan view of the same;

FIG. 8 is a chart showing the emission spectra of the light emitted from a particular fabrication of a semiconductor light-emitting apparatus of FIGS. 5A-B as compared to a comparative semiconductor light-emitting apparatus.

DETAILED DESCRIPTION OF PREFERRED EMBODIMENTS

Figure 1:
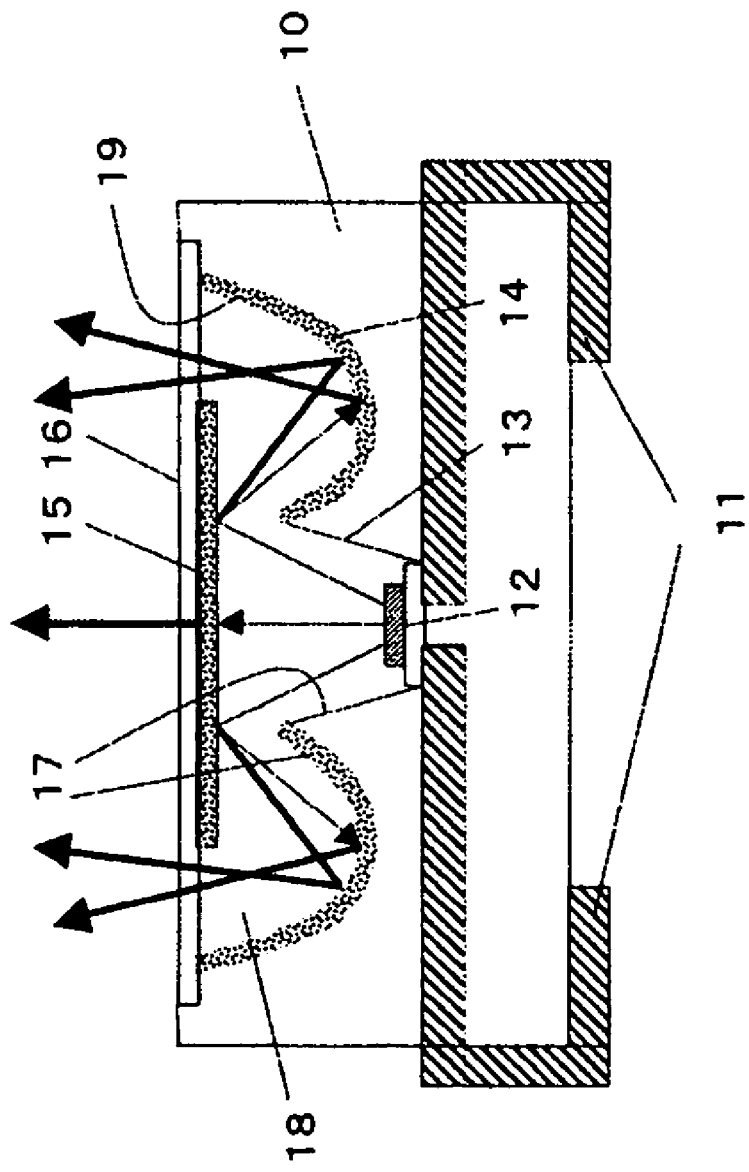
FIG. 1 is a schematic diagram showing a semiconductor light-emitting apparatus according to a known packaging technique.

Hereinafter, description will be given of the present invention with reference to the drawing figures, wherein like reference numerals designate identical or corresponding elements throughout the several figures. Incidentally, various modifications can be made without departing from the gist of the invention. It is intended that various modifications of the exemplary embodiments described herein can be made and would fall within the scope of the present invention.

Figure 2:
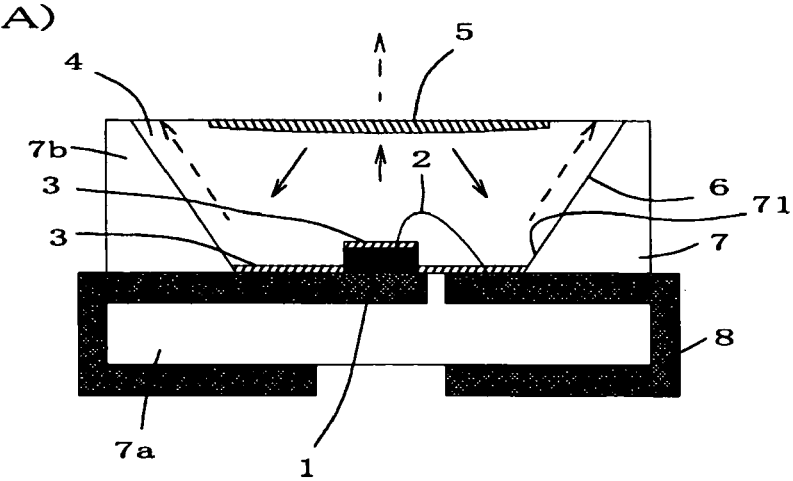
FIGS. 2A-2C are schematic diagrams showing an embodiment of a semiconductor light-emitting apparatus made in accordance with the principles of the present invention, where
Figure 2:
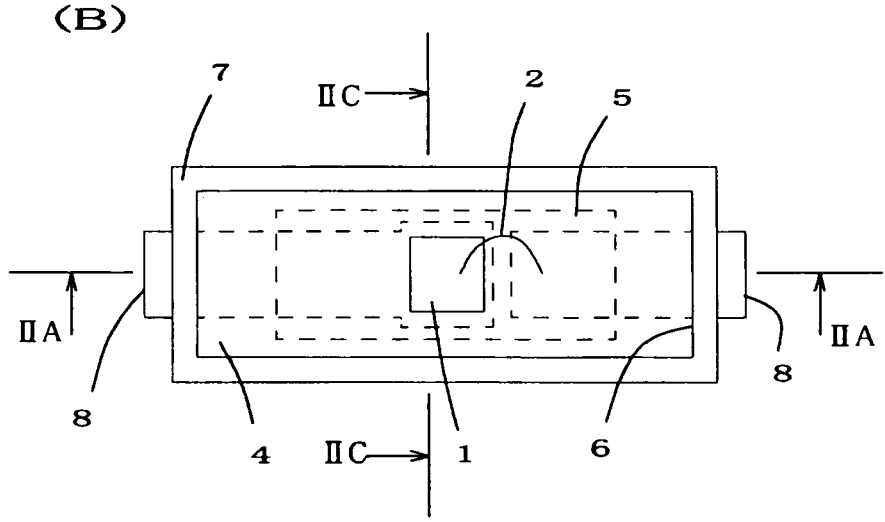
Figure 2:
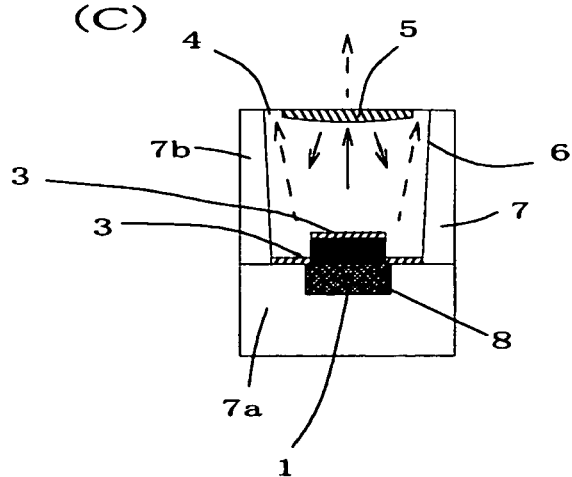

FIGS. 2A-2C are explanatory diagrams showing an embodiment of the semiconductor light-emitting apparatus made in accordance with the principles of the invention. FIG. 2A is a sectional view taken along the line IIA-IIA of FIG. 2B. FIG. 2B is a schematic plan view. FIG. 2C is a sectional view taken along the line IIC-IIC of FIG. 2B.

The semiconductor light-emitting apparatus of FIG. 2A can include an insulating base 7, a semiconductor light-emitting device 1, and a wavelength conversion portion. The insulating base 7 can also include a concave portion 6. The semiconductor light-emitting device 1 can be arranged at the bottom of the concave portion 6. Here, the wavelength conversion portion can be composed of a first wavelength conversion layer 3 formed on the bottom of the concave portion 6, and a second wavelength conversion layer 5 formed in the opening of the concave portion 6 at a distance above the semiconductor light-emitting device 1. The space defined by the concave portion 6 of the base 7 and the second wavelength conversion layer 5 can be filled with a sealing material 4 for transmitting light emitted from the semiconductor light-emitting device 1.

The base 7 can include and/or consist of a substrate part 7a and a reflecting frame part 7b. The substrate part 7a can be provided with at least a pair of lead electrodes 8, or an anode electrode and a cathode electrode. The lead electrodes 8 can project out of the base 7. The reflecting frame part 7b can be arranged on the substrate part 7a and can have the concave portion 6 in its center. The pair of lead electrodes 8 can be formed so that the electrodes 8 are exposed in the bottom area of the concave portion 6. In the shown example, the semiconductor light-emitting device is surrounded by the reflecting frame part 7b, and the concave portion 6 is formed in the center of the same. Nevertheless, the reflecting frame part 7b may be formed in other manners, including on either one of the pairs of opposed sides and not on the other. For example, in the plan view of FIG. 2B, the reflecting frame part 7b can be formed on the right and left alone, and not on the top and bottom. The concave portion 6 can be formed in the middle.

Examples of the methods for forming the concave portion 6 into which the semiconductor light-emitting device 1 can be arranged and fixed are, though not restrictive, described as follows.

Integral molding methods can be used such that the electrodes 8 are loaded as insert members into a mold, and the material is injected into the mold so that the base 7 (the substrate part 7a and the reflecting frame part 7b) is insert-molded.

Bonding-after methods can be used such that the electrodes 8 are fixed to the surface of the substrate part 7a before the reflecting frame part 7b is attached to form the base 7.

The material(s) for making the base 7 can be selected from among ones that develop no electric short circuit between the anode and cathode electrodes, or the lead electrodes 8. The substrate part 7a can be made of an insulating material such as insulating resins including a glass fiber containing epoxy resin, and ceramics. In a practical viewpoint, it is sometimes preferable to use materials having relatively high melting points so that no deformation occurs at temperatures expected at the time of packaging with solder materials. The reflecting frame part 7b can be made of an insulating material having heat resistance to soldering temperatures (around 200° C. or below), such as high melting point insulating resins made of liquid polymers including liquid crystal polyester, and ceramics. It may also be preferable for the concave portion 6 to be formed in the center, and that the material be white or the like in color, having a certain degree of high reflectivity. For integral molding, the substrate part 7a and the reflecting frame part 7b can be made of liquid crystal polymers. White liquid crystal polymer materials are sometimes superior in many respects, including insulation performance, heat resistance, high reflectivity, and formability. In addition, a layer of high reflectivity material may be formed on the inside 71 of the concave portion 6 of the base 7 by such means as coating, plating, vapor deposition, and the like.

The concave portion 6 may be shaped generally like a truncated cone, a truncated pyramid, partially hemispherical surface, etc. The concave portion 6 can also have an inclined inner periphery. However, in the case of a white LED intended for use as a light source of a display backlight in a cellular phone, the inner periphery may be shaped generally perpendicular for the sake of a desired reduction in device profile. Thus, the reflecting frame part 7b can be generally rectangular in the angle of the inner periphery without departing from the spirit and scope of the invention.

The semiconductor light-emitting device 1 can be attached to the bottom of the concave portion 6. In the example shown in FIGS. 2A-2C, the semiconductor light-emitting device 1 is electrically and mechanically fixed onto one of the electrodes 8 by die bonding using an Ag paste. A conductive wire 2 that extends from the top of the semiconductor light-emitting device and the other electrode 8 can be connected by wire bonding.

The semiconductor light-emitting device 1 may be made of any semiconductor material, and preferably of a material that emits light having energy capable of exciting the wavelength conversion material. Semiconductor materials for emitting light in the range of ultraviolet light and blue light are preferable in particular instances. It is also sometimes preferable that the semiconductor light-emitting device 1 fall within the range of 300 and 490 nm in the light emission peak wavelength. Examples of the semiconductor materials for making the semiconductor light-emitting device 1 include light-emitting diodes (LEDs) such as group-III nitride compound (for example, In—Ga—Al—N compound) semiconductors, zinc oxide compound (for example, Zn—Mg—O compound) semiconductors, zinc selenide compound (for example, Zn—Mg—Se—S—Te compound) semiconductors, and silicon carbide compound (for example, Si—Ge—C) semiconductors. However, the semiconductor materials are not limited thereto. It is only preferable in certain circumstances that they emit light within the foregoing range of light emission peak wavelengths. Incidentally, semiconductor light-emitting devices fixed onto sub mounts shall also be referred to as "semiconductor light-emitting devices" and fall within the scope of the present invention.

Note that the embodiment of FIGS. 2A-2C deals with the case where the bottom side of the semiconductor light-emitting device 1 establishes electric connection with one of the electrodes 8, and the top side establishes electric connection with the other electrode 8. It is also possible, however, to use a semiconductor device that can establish electric connection with both the electrodes 8 at an identical side, or to different combinations of side, bottom or top mount electrodes.

For example, if a semiconductor device that has a pair of LED electrodes on its top side is used as a semiconductor light-emitting device 1 as shown in FIGS. 2A-2C, the semiconductor light-emitting device can be mechanically bonded onto the substrate part 7a with an adhesive such as an epoxy resin. The anode and cathode electrodes formed on the top side of the semiconductor light-emitting device can be electrically bonded to the respective corresponding lead electrodes 8 in pair by conductive wires 2. Among other typical electrode connection methods available are the following: those in which the anode and cathode electrodes of the semiconductor light-emitting device 1 are electrically connected to the corresponding lead electrodes 8 and the device is fixed to the base 7 at the same time by such means as Au—Sn or other eutectic materials, Au bumps, anisotropic conductive sheets, and conductive resins typified by an Ag paste; and those in which either one of the electrodes of the device is electrically connected to the corresponding lead electrode 8 and fixed to the base 7 by using the foregoing materials while the other electrode and the corresponding lead electrode 8 are electrically bonded by a conductive wire. Furthermore, in order to improve the heat radiation of the semiconductor light-emitting device 1, the base 7 may be made of metal or other conductive materials. Here, the base 7 may also function as one of the lead electrodes 8.

There are various forms available for the base 7, the semiconductor light-emitting device 1, and the lead electrodes 8. Regardless of the form that is used, the semiconductor light-emitting device 1 can be fixed onto the base 7, and the anode and cathode lead electrodes 8 can be electrically connected to the corresponding anode and cathode electrodes of the semiconductor light-emitting device 1.

The first wavelength conversion layer 3 can be formed in the bottom area of the concave portion 6. In the example shown in FIGS. 2A-2C, the first wavelength conversion layer 3 is formed on the top area of the substrate part 7a and on the semiconductor light-emitting device 1 at the bottom of the concave portion 6. The first wavelength conversion layer 3 can have one or more layers of wavelength conversion materials within a thickness smaller than the height of the semiconductor light-emitting device 1. The ideal thickness depends on various properties, including the wavelength conversion efficiencies of various wavelength conversion materials. In a practical viewpoint, the wavelength conversion layer can have a thickness around 20 to 200 μm since the semiconductor light-emitting device generally has a thickness of 300 μm or so. As employed in this specification, the "wavelength conversion portion (or layer)" will refer not only to the layer made of wavelength conversion material alone, but also to the entire area where wavelength conversion material concentrates densely. Suppose, for example, that phosphor particles, or wavelength conversion material, are mixed into a thermosetting resin. Then, the wavelength conversion layer can refer to an entire area of the sealing portion 4 to be described later where the phosphor particles are distributed densely.

Although not a restrictive list of methods, the first wavelength conversion layer 3 may be formed by any of the following methods: (1) placing the semiconductor light-emitting device 1 on the bottom of the concave portion 6, and then applying a wavelength conversion material such as an inorganic phosphor directly to the bottom of the concave portion 6 to form the first wavelength conversion layer 3; (2) mixing the wavelength conversion material for forming the first wavelength conversion layer 3 into the material for forming the sealing portion 4, injecting the mixed material into the concave portion 6, and hardening the sealing portion 4 when the wavelength conversion material in the mixed material settles out to the bottom area of the concave portion 6 by its own weight and lies densely in this area, so that this area creates the first wavelength conversion layer 3; and (3) attaching, onto the bottom of the concave portion 6a, a wavelength-conversion-material-containing sheet that has a predetermined thickness and a wavelength conversion material at a predetermined density.

The first wavelength conversion layer 3 can also be formed on the top of the semiconductor light-emitting device 1. Here, the semiconductor light-emitting apparatus can be improved by providing a more even intensity distribution due to the excitation light being emitted directly upward from the semiconductor light-emitting device 1. This configuration allows light to be wavelength converted and scattered as well.

Figure 5:
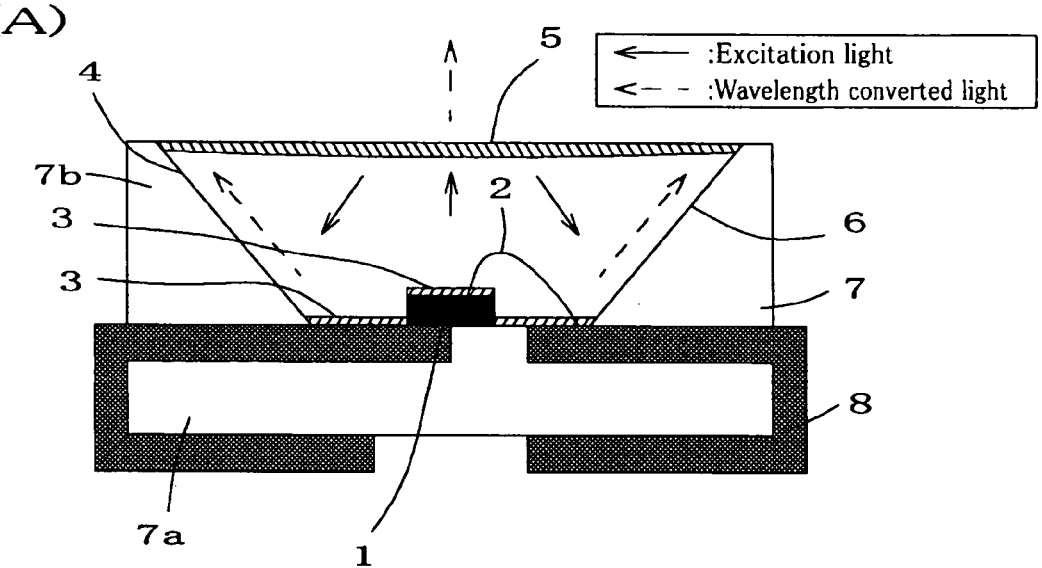
FIGS. 5A and 5B are schematic diagrams showing another embodiment of a semiconductor light-emitting apparatus made in accordance with the principles of the invention, where
Figure 5:
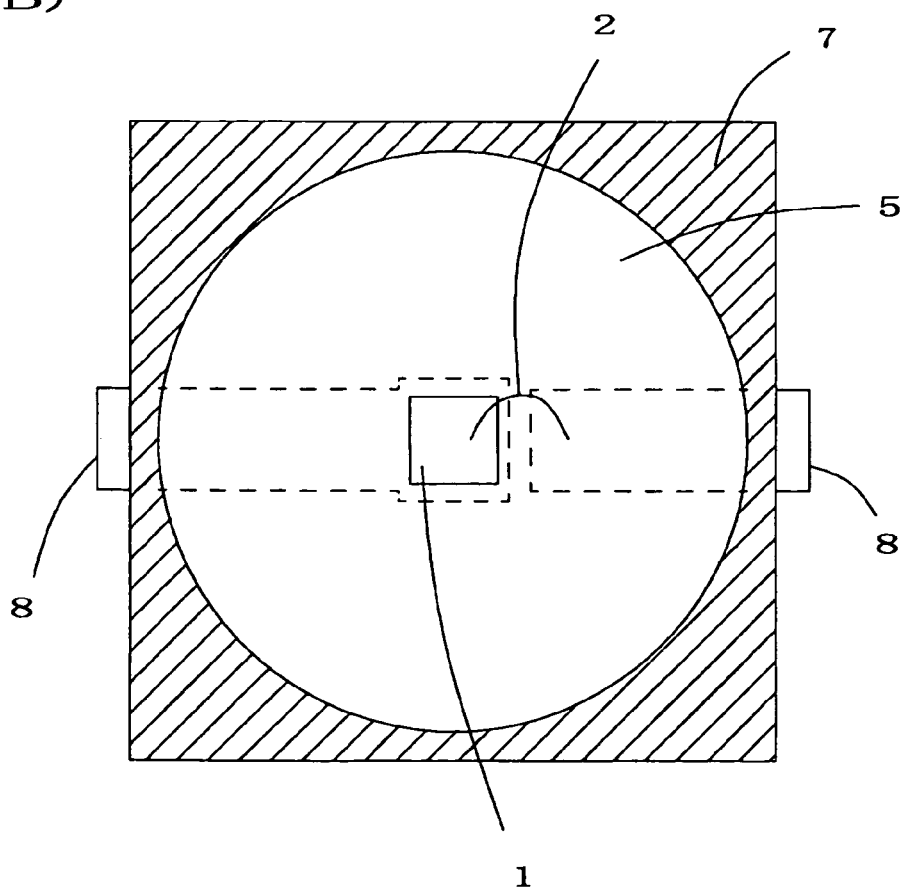

In FIGS. 2(A), 2(C) and 5(A), the first wavelength conversion layer 3 has approximately the same thickness throughout the layer. However, distribution of phosphors that form the first wavelength conversion layer 3 is not limited thereto, and can include various thickness layers and layers that have changing thicknesses.

The sealing portion 4 can be made of a light transmitting material which maintains the distance from the semiconductor light-emitting device 1 and the first wavelength conversion layer 3 to the second wavelength conversion layer 5. The material may also be capable of transmitting both the excitation light from the semiconductor light-emitting device 1 and the wavelength conversion light converted by the wavelength conversion material. Some examples include thermosetting resins and low melting point glass. Incidentally, if the second wavelength conversion layer 5 is a preformed sheet, the sealing portion 4 may be formed to be hollow (or sealed with a gaseous material) when accompanied with a configuration that fixes the sheet to the reflecting frame part 7b.

Examples of materials that can be used for making the sealing portion 4 are the following: materials that have a high transmittance up to shortwave regions covering the peak wavelength of light emission from the semiconductor light-emitting device 1; materials that have a constituent material of the first wavelength conversion layer 3 that can be mixed and dispersed therein; and materials in which the constituent material of the first wavelength conversion layer 3 can settle out (be distributed) densely at the bottom of the concave portion 6 when heated and left standing, etc. Specific examples include thermosetting resins containing at least one resin selected from the group consisting of epoxy resins, silicone resins, polydimethylsiloxane derivatives having epoxy groups, oxetane resins, acryl resins, and cycloolefin resins. To reduce ultraviolet-based yellowing, epoxy resins made of epoxy resin materials containing hydrogenated bisphenol A diglycidyl ether, alycyclic epoxy carboxylate, and organic sulfonium-hexafluoroantimonate can be used.

The sealing portion 4 can be shaped so that its top surface that corresponds to a position substantially directly above the semiconductor light-emitting device 1 sinks into a generally recessed surface. This can facilitate the formation of the second wavelength conversion layer 5. In addition, the second wavelength conversion layer 5 can efficiently scatter the excitation light and the once-wavelength-converted light which is wavelength-converted by the first wavelength conversion layer 3. Examples of methods that can be used to form a generally recessed surface on the sealing portion 4 are as follows: heating the material of the sealing portion 4 for hardening, at which time the surface is formed naturally through solvent evaporation; controlling the composition of the material of the sealing portion 4 and the amount of injection of the same to cause a meniscus phenomenon, and harden it in that state to form the recessed surface; and forming the recessed surface by compression molding or the like.

The second wavelength conversion layer 5 can be arranged at an appropriate distance from the semiconductor light-emitting device 1 and the first wavelength conversion layer 3 so that it covers the vicinity of the opening end of the concave portion 6 (see FIG. 2A), at least over the semiconductor light-emitting device 1 in plan view. In the embodiment shown in FIG. 2B, the second wavelength conversion layer 5 is arranged at the center of the opening of the concave portion 6 and has an area narrower than the opening. In another embodiment shown in FIGS. 5A and 5B, the second wavelength conversion layer 5 is formed to cover the entire opening of the concave portion 6.

The second wavelength conversion layer 5 can be formed by mixing an appropriate binder resin and a wavelength conversion material, and arranging this mixed material onto the sealing portion 4 directly above the semiconductor light-emitting device 1 by such means as potting using a dispenser. As described previously, the sealing portion 4 can be shaped so that its top sinks into a generally curved surface. The recess formed in the top of the sealing portion 4 can be filled with the constituent material of the second wavelength conversion layer 5 to form the second wavelength conversion layer 5. The binder resin of the second wavelength conversion layer 5 may be the same material as the constituent material of the sealing portion 4. Any material may be used and preferably has excellent adhesiveness with the sealing portion 4 and causes little or no degradation due to the excitation light.

As for the thickness of the second wavelength conversion layer 5, even a single layer of particles of the wavelength conversion material is effective. Since excessive thicknesses can lower the output efficiency, a thickness in the range of 20 µm to 150 µm may be desirable in some circumstances. A thickness that is smaller than that of the first wavelength conversion layer 3 is also often preferable.

The wavelength conversion materials for forming the first wavelength conversion layer 3 and the second wavelength conversion layer 5 convert the peak wavelength of light emission from the semiconductor light-emitting device 1 into longer peak wavelengths of light emission. The wavelength conversion materials may contain one or more types of materials. In consideration of color unevenness, the first wavelength conversion layer 3 and the second wavelength conversion layer 5 can be made of the same wavelength conversion material. Nevertheless, the first wavelength conversion layer 3 and the second wavelength conversion layer 5 may be made of respective different wavelength conversion materials, depending on the physical properties of the constituent materials, such as reflectance. Examples of wavelength conversion materials include the following. $A_3B_5O_{12}$:M phosphors (A: at least one element selected from among Y, Gd, Lu, and Tb; B: at least one element selected from Al and Ga; and M: at least one ion selected from among $Ce^{3+}$, $Tb^{3+}$, $Eu^{3+}$, $Cr^{3+}$, $Nd^{3+}$, and $Er^{3+}$); rare-earth doped barium-aluminum-magnesium compound phosphors (BAM phosphors); sulfide compound phosphors typified by $Y_2O_2S$:$Eu^{3+}$ and ZnS:Cu, Al; rare-earth doped thiogallate phosphors such as (Sr, Ca)S:$Eu^{2+}$, $CaGa_2S_4$:$Eu^{2+}$, and $SrGa_2S_4$:$Eu^{2+}$; and phosphors containing at least one of aluminate compositions such as $TbAlO_3$:$Ce^{3+}$. These phosphors may be used alone, or two or more types in combination. If necessary, the wavelength conversion layers may include scattering agents such as barium sulfate, magnesium oxide, and/or silicon oxide for the sake of assisting the reflection of the excitation light and the wavelength conversion light.

Even if the excitation light resides in the ultraviolet or near-ultraviolet region and does not include a white light source, the excitation light can undergo the same wavelength conversion, reflection, etc. as in the foregoing case where the excitation light constitutes a light source of white light. The light can be emitted from the opening of the concave portion 6. When the excitation light is in the ultraviolet or near-ultraviolet region, however, the external emission of the excitation light can cause the ultraviolet degradation of electronic parts such as a light guide plate. It may therefore be preferable to prevent the excitation light from being emitted outside of the light-emitting apparatus as much as possible. In the case where the excitation light should be excluded from the light to be emitted from the semiconductor light-emitting apparatus, or, for example, where a semiconductor light-emitting device for emitting ultraviolet rays is used, then, it is usually preferable that the thicknesses and constituent materials of the first wavelength conversion layer 3 and the second wavelength conversion layer 5 be adjusted to reduce ultraviolet rays to be emitted outside. The external emission of the ultraviolet rays can also be reduced by configuring the semiconductor light-emitting apparatus so that the light emitted from the semiconductor light-emitting device always takes the path through the first wavelength conversion layer 3 and/or the second wavelength conversion layer 5. For example, in the embodiment shown in FIGS. 5A and 5B, the second wavelength conversion layer 5 is arranged to cover the entire opening of the concave portion 6 so that all the emitted light can be turned into wavelength conversion light.

A semiconductor light-emitting apparatus having an oblong rectangular shape in plan view as shown in FIGS. 2A and 2B was fabricated. A description of this specific fabrication is now provided as an example of an apparatus and method that corresponds to the embodiment shown in FIGS. 2A-C. Initially, a white thermosetting resin having a high melting point was insert molded with Ag-plated lead electrodes 8 as the insert members. As a result, a base 7 having a concave portion 6 and integrated electrodes 8 was fabricated. Here, in the section taken along the line IIC-IIC shown in FIG. 2C, the concave portion 6 was formed so that the top surfaces of the lead electrodes 8 and the inside of the concave portion 6 of the reflecting frame part 7b formed an angle of approximately 90°. Furthermore, in the section taken along the line IIA-IIA of FIG. 2A, the concave portion 6 was formed so that the top surfaces of the lead electrodes 8 and the inside of the concave portion 6 of the reflecting frame part 7b formed an obtuse angle.

For the semiconductor light-emitting device 1, a semiconductor device for emitting blue light, made of an InGaN compound semiconductor (having a light emission peak wavelength of 470 nm) formed on an n-type SiC substrate, was used. A cathode electrode formed on this n-type substrate and its corresponding lead electrode 8 were electrically bonded to each other and mechanically fixed to the base 7 with an Ag paste.

Next, for the sake of simultaneous formation of the first wavelength conversion layer 3 and the sealing portion 4, an epoxy resin was mixed with an appropriate amount of YAG phosphor to form the constituent material. Incidentally, YAG phosphors generate wavelength conversion light of yellow when excited by blue light of near 470 nm. This constituent material was filled into the concave portion 6, and left standing so that the phosphor naturally settled out to the bottom area of the concave portion 6. Then, under the condition of 150° C. and after 1 hour, the material was hardened to simultaneously form the first wavelength conversion layer 3 and the sealing portion 4.

Next, the constituent material of the second wavelength conversion layer 5, i.e., a mixed material of epoxy resin and the previously described phosphor, was applied to a recess in the top of the sealing portion 4 which had been generated by itself during the hardening of the epoxy resin. The resultant mixture was hardened at 150° C. for one hour, to form the second wavelength conversion layer 5.

Figure 4:
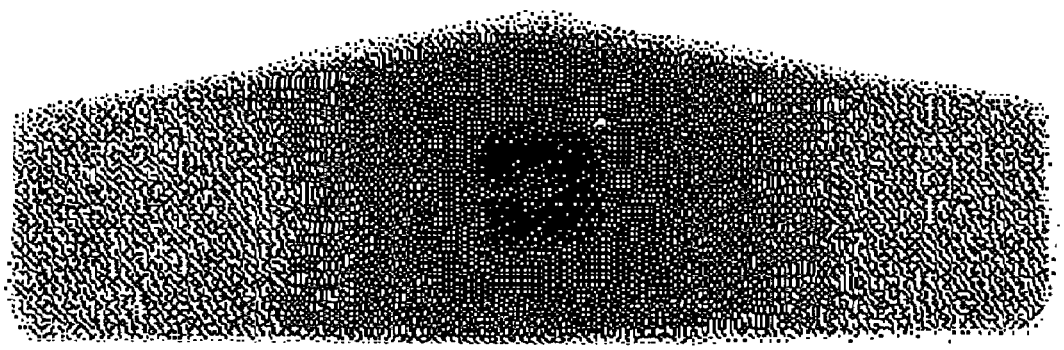
FIG. 4 is a diagram showing the intensity distribution of a particular fabrication of the semiconductor light-emitting apparatus of FIGS. 2A-2C.

FIG. 4 shows the intensity distribution of the semiconductor light-emitting apparatus, as viewed from its optical axis, when the semiconductor light-emitting device as described in the above fabrication description was energized and lit by a current of 1 mA. In FIG. 4, white areas have higher intensities, and black areas lower intensities.

For a comparative example, a semiconductor light-emitting apparatus having the same oblong rectangular shape was fabricated under the same condition as in the above described configuration/fabrication of the embodiment of FIGS. 2A-C. In the comparative example, the first wavelength conversion layer 3 and the sealing portion 4 were formed under the same conditions, whereas the second wavelength conversion layer 5 was not formed.

Figure 3:
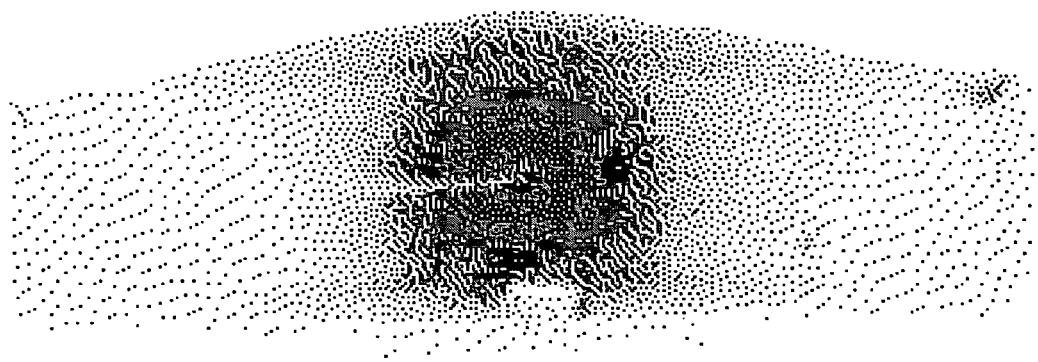
FIG. 3 is a diagram showing the intensity distribution of a comparative example of the semiconductor light-emitting apparatus of FIGS. 2A-2C.

FIG. 3 shows the intensity distribution of the semiconductor light-emitting apparatus, as viewed from its optical axis, when the semiconductor light-emitting device of the comparative example (without the second wavelength conversion layer 5) was energized and lit by the same current of 1 mA. Again, in FIG. 3, white areas have higher intensities, and black areas lower intensities.

As shown in FIG. 3, blue light to white light were observed with high intensities in the semiconductor light-emitting apparatus of the comparative example since the excitation light from the semiconductor light-emitting device 1 was dominant in the area immediately near the device 1. In the surrounding areas away from the area immediately near the semiconductor light-emitting device 1, on the other hand, it was observed that the wavelength conversion light from the wavelength conversion material, i.e., yellow light, was dominant. Moreover, as compared to the area immediately near the semiconductor light-emitting device 1, the surrounding areas were significantly low in intensity, with remarkable unevenness both in the intensity distribution and in color on the whole.

In contrast, the semiconductor light-emitting apparatus used to create the light intensity distribution of FIG. 4 showed more uniform white light emission over almost all areas, with no noticeable unevenness in intensity distribution as compared to that of FIG. 3.

Next, a semiconductor light-emitting apparatus having a square shape in plan view as shown in FIGS. 5A and 5B was fabricated. A description of this specific fabrication (fabrication II) is now provided as an example of an apparatus and method that corresponds to the embodiment shown in FIGS. 5A-B.

Initially, a white thermosetting resin having a high melting point was insert molded with Ag-plated lead electrodes 8 as the insert members. As a result, a base 7 having a concave portion 6 and integrated electrodes 8 was fabricated. Here, the concave portion 6 was shaped like a bowl so that the top surfaces of the lead electrodes 8 and the inside of the concave portion 6 of the reflecting frame part 7b formed an angle of approximately 50°.

For the semiconductor light-emitting device 1, a semiconductor device for emitting ultraviolet rays, made of an InGaN compound semiconductor (having a light emission peak wavelength of 395 nm) formed on an n-type SiC substrate, was used. A cathode electrode formed on this n-type substrate and its corresponding lead electrode 8 were electrically bonded to each other and mechanically fixed to the base 7 with an Ag paste.

Next, for the sake of simultaneous formation of the first wavelength conversion layer 3 and the sealing portion 4, predetermined proportions of blue, red, and green light emission phosphors, or a barium-aluminum-magnesium compound phosphor (BAM phosphor), $Y_2O_2S:Eu^{3+}$, and ZnS:Cu, Al, respectively, were mixed to form a wavelength conversion material. The thus obtained mixed phosphors were mixed and dispersed into an epoxy resin at a rate of 20% by weight. The employed epoxy resin contained a certain amount of UV absorbents. Alternatively, it can be noted that resin having high UV resistance by itself may have been used. The resulting constituent material was filled into the concave portion 6, and left standing so that the phosphors naturally settled out to the bottom area of the concave portion 6. Then, under the condition of 150° C. and after 1 hour, the material was hardened to simultaneously form the first wavelength conversion layer 3 and the sealing portion 4.

Next, the constituent material of the second wavelength conversion layer 5, i.e., the mixed material that included epoxy resin and 20% by weight of the foregoing described mixed phosphors, was applied to a recess in the top of the sealing portion 4 which had been generated by itself during the hardening of the epoxy resin. The resultant material was hardened at 150° C. for one hour to form the second wavelength conversion layer 5. Note that in the previously described fabrication, the second wavelength conversion layer 5 was formed only in the center area of the opening of the concave portion 6, not in the surrounding areas. In the presently described fabrication, the second wavelength conversion layer 5 was formed over the entire opening of the concave portion 6 as shown in FIGS. 5A and 5B. The first wavelength conversion layer 3 and the second wavelength conversion layer 5 both had a thickness of approximately 130 μm.

Figure 7:
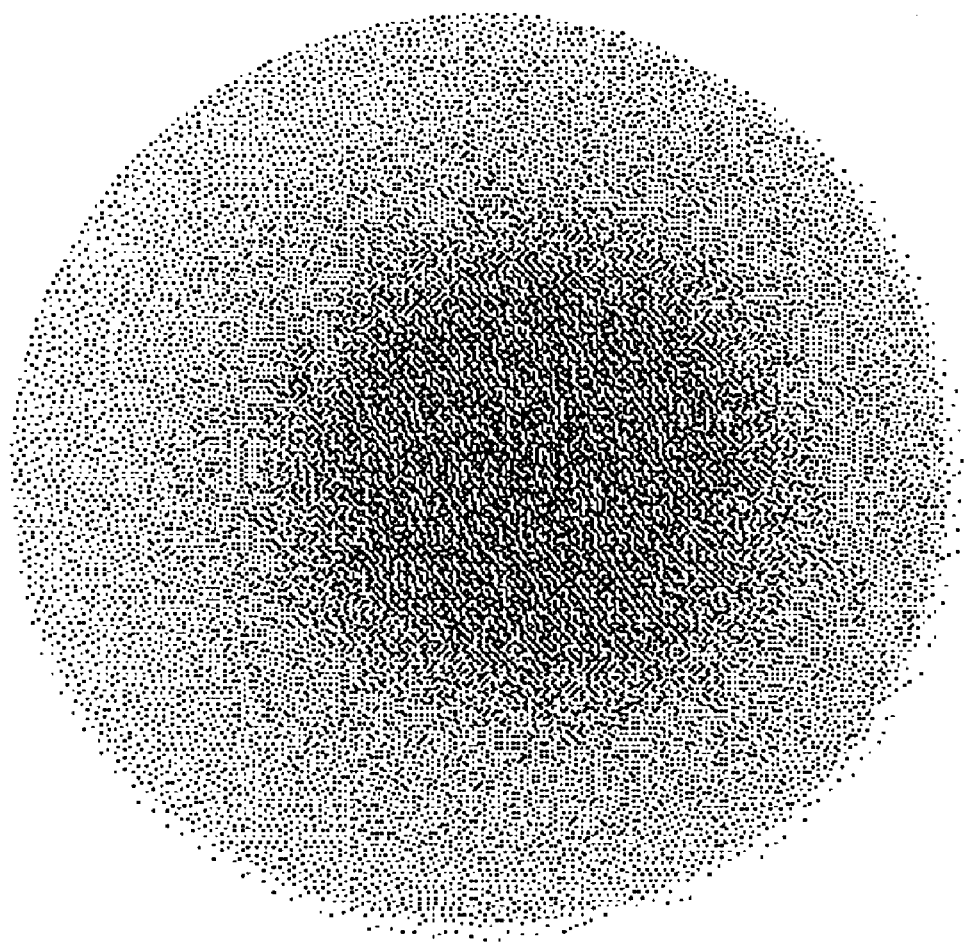
FIG. 7 is a diagram showing the intensity distribution of a particular fabrication of the semiconductor light-emitting apparatus of FIGS. 5A-B.

FIG. 7 shows the intensity distribution of the semiconductor light-emitting apparatus, as viewed from its optical axis, when the above-described fabrication II of the semiconductor light-emitting device was energized and lit by a current of 1 mA. In FIG. 7, white areas have higher intensities, and black areas lower intensities.

For comparative example, a semiconductor light-emitting apparatus having the same square shape was fabricated under the same conditions as in fabrication II. In the comparative fabrication example however, the first wavelength conversion layer 3 and the sealing portion 4 were formed under the same conditions, whereas the second wavelength conversion layer 5 was not formed.

Figure 6:
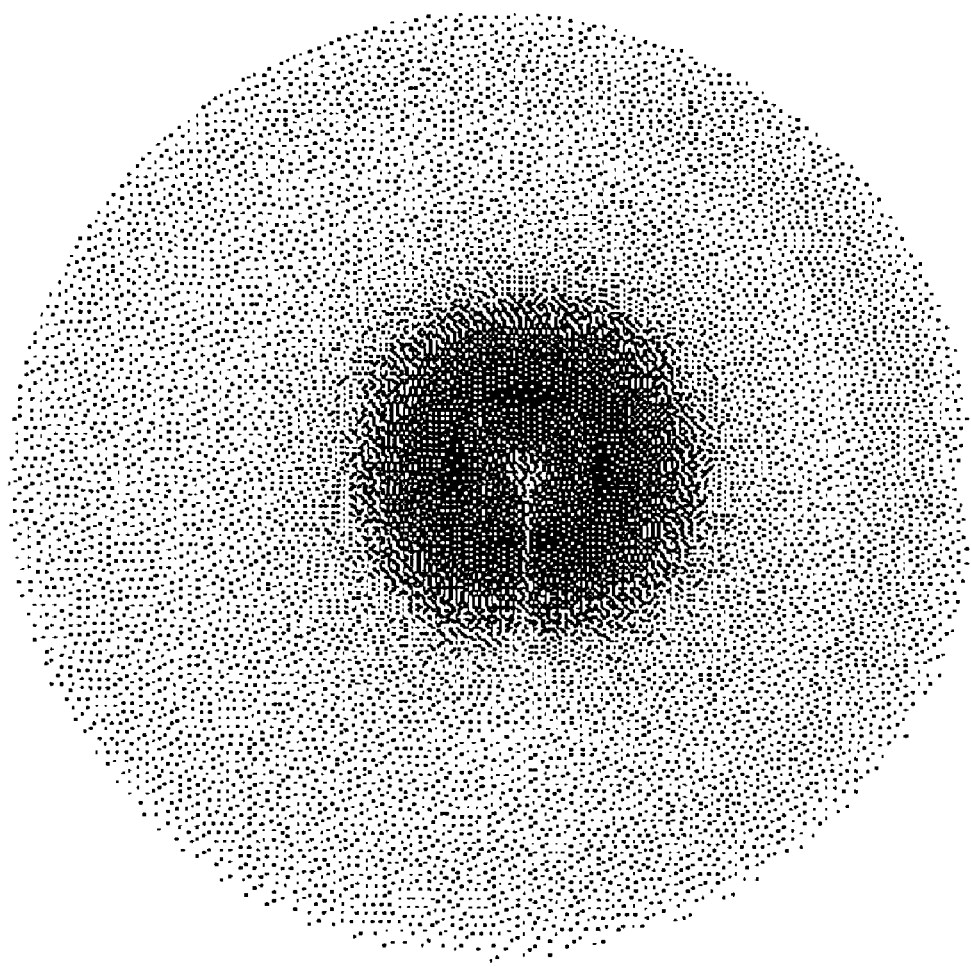
FIG. 6 is a diagram showing the intensity distribution of a comparative example of the semiconductor light-emitting apparatus of FIGS. 5A-B.

FIG. 6 shows the intensity distribution of the semiconductor light-emitting apparatus, as viewed from its optical axis, when the semiconductor light-emitting device of the comparative example to fabrication II was energized and lit by the same current of 1 mA as was used with fabrication II. Again, in FIG. 6, white areas have higher intensities, and black areas lower intensities.

As shown in FIG. 6, when the semiconductor light-emitting apparatus of the comparative example to fabrication II was used, light emission of high intensity was observed only in the area immediately near the semiconductor light-emitting device 1. This shows significant unevenness in the intensity distribution. Meanwhile, as shown in FIG. 7, uniform light emission is exhibited substantially all over, with substantially no noticeable unevenness in the intensity distribution as compared to FIG. 6.

To check how much of the excitation light from the ultraviolet light-emitting device 1 (i.e., the ultraviolet rays) was included in the constituent sources of the light emitted from the semiconductor light-emitting apparatus, a spectral analysis was conducted on the light emitted from the semiconductor light-emitting apparatuses of the fabrication II device and the comparative example to fabrication II device. FIG. 8 shows the results. In the spectral analysis, the semiconductor light-emitting apparatuses were installed in the integrating sphere of a spectroscopic analyzer, energized by a current of 20 mA, and measured for the light emitted at that time.

It can be confirmed from FIG. 8 that the light emitted from the semiconductor light-emitting apparatus according to fabrication II contains 50% or less excitation light, i.e., light having a peak wavelength of 395 nm, as compared to the comparative example to fabrication II described above where the second wavelength conversion layer is not formed.

While there has been described what are at present considered to be exemplary embodiments of the invention, it will be understood that various modifications may be made thereto, and it is intended that the appended claims cover all such modifications as fall within the true spirit and scope of the invention.

Having described exemplary embodiments consistent with the invention, other embodiments and variations consistent with the invention will be apparent to those skilled in the art. Therefore, the invention should not be viewed as limited to the disclosed embodiments but rather should be viewed as limited only by the spirit and scope of the appended claims.

What is claimed is:

1. A semiconductor light-emitting apparatus comprising:
   a base having a concave portion with a bottom and an opening;
   a pair of electrodes located adjacent the bottom of the concave portion;
   a semiconductor light-emitting device located adjacent the bottom of the concave portion and being electrically connected with the pair of electrodes;
   a wavelength conversion portion capable of changing the wavelength of light emitted from the semiconductor light-emitting device, wherein the wavelength conversion portion includes a first wavelength conversion layer formed adjacent the bottom of the concave portion and a second wavelength conversion layer formed in the opening of the concave portion and at a distance above the semiconductor light-emitting device; and a space defined by the base and the second wavelength conversion layer, the space being provided with a sealing portion containing a material capable of substantially transmitting the light emitted from the semiconductor light-emitting device and wavelength conversion light emitted from the first and second wavelength conversion layers, wherein the first wavelength conversion layer is formed in a bottom portion of the sealing portion.

2. The semiconductor light-emitting apparatus according to claim 1, wherein a top surface of the sealing portion located substantially directly above the semiconductor light-emitting device includes a recessed portion that is recessed toward the semiconductor light-emitting device.

3. The semiconductor light-emitting apparatus according to claim 1, wherein at least one of the first wavelength conversion layer and the second wavelength conversion layer includes at least one type of phosphor selected from the group consisting of: phosphors having the composition of $A_3B_5O_{12}$:M, where A includes at least one element selected from among Y, Gd, Lu, and Tb, B includes at least one element selected from Al and Ga, and M includes at least one ion selected from among $Ce^{3+}$, $Tb^{3+}$, $Eu^{3+}$, $Cr^{3+}$, $Nd^{3+}$, and $Er^{3+}$; rare-earth doped barium-aluminum-magnesium compound phosphors; sulfide compound phosphors; rare-earth doped thiogallate phosphors; and aluminate phosphors.

4. The semiconductor light-emitting apparatus according to claim 1, wherein the material of the sealing portion includes at least one resin selected from the group consisting of: epoxy resins; silicone resins; polydimethylsiloxane derivatives having epoxy groups; oxetane resins; acryl resins; and cycloolefin resins.

5. A semiconductor light-emitting apparatus comprising:
a base having a concave portion with a bottom and an opening;
a pair of electrodes located adjacent the bottom of the concave portion;
a semiconductor light-emitting device located adjacent the bottom of the concave portion and being electrically connected with the pair of electrodes;
a wavelength conversion portion capable of changing the wavelength of light emitted from the semiconductor light-emitting device, wherein the wavelength conversion portion includes a first wavelength conversion layer formed adjacent the bottom of the concave portion and a second wavelength conversion layer formed in the opening of the concave portion and at a distance above the semiconductor light-emitting device; and
a space defined by the base and the second wavelength conversion layer, the space being provided with a sealing portion containing a material capable of substantially transmitting the light emitted from the semiconductor light-emitting device and wavelength conversion light emitted from the first and second wavelength conversion layers, wherein
the second wavelength conversion layer is formed to cover the entire opening of the concave portion.

6. The semiconductor light-emitting apparatus according to claim 1, wherein the first wavelength conversion layer is formed on a top surface of the semiconductor light-emitting device located adjacent the bottom of the concave portion.

7. A method of fabricating a semiconductor light-emitting apparatus comprising:

providing a base having a concave portion with a bottom, a pair of electrodes, a semiconductor light-emitting device located adjacent the bottom of the concave portion and being electrically connected with the pair of electrodes, a wavelength conversion portion configured to change the wavelength of light emitted from the semiconductor light-emitting device, and a sealing portion having a constituent material and being located adjacent the concave portion;

loading the semiconductor light-emitting device onto the concave portion of the base so as to be electrically connected with the pair of electrodes;

forming a first wavelength conversion layer configured to perform as the wavelength conversion portion on the bottom of the concave portion;

injecting the constituent material of the sealing portion into the concave portion;

hardening the constituent material of the sealing portion to form the sealing portion; and forming a second wavelength conversion layer configured to perform as the wavelength conversion portion on the sealing portion, wherein forming a first wavelength conversion layer includes forming the first wavelength conversion layer along a substantially flat planar portion of the bottom of the concave portion.

8. The method of fabricating a semiconductor light-emitting apparatus according to claim 7, wherein forming the first wavelength conversion layer includes applying a wavelength conversion material to the bottom of the concave portion to form the first wavelength conversion layer.

9. The method of fabricating a semiconductor light-emitting apparatus according to claim 7, wherein forming the first wavelength conversion layer includes placing a wavelength-conversion-material-containing sheet that has a predetermined thickness and a wavelength conversion material at a predetermined density on the concave portion to form the first wavelength conversion layer.

10. A method of fabricating a semiconductor light-emitting apparatus comprising:

providing a base having a concave portion with a bottom, a pair of electrodes, a semiconductor light-emitting device located adjacent to the bottom of the concave portion and being electrically connected with the pair of electrodes, a wavelength conversion portion configured to change the wavelength of light emitted from the semiconductor light-emitting device, and a sealing portion;

loading the semiconductor light-emitting device onto the concave portion of the base so as to be electrically connected with the pair of electrodes;

injecting a mixed material into the concave portion, the mixed material being a mixture of a material for forming the sealing portion and a wavelength conversion material for forming the wavelength conversion portion;

densifying the wavelength conversion material along a substantially flat planar portion of a bottom area of the concave portion so that a part of the bottom area of the concave portion where the wavelength conversion material is densified creates a first wavelength conversion layer configured to perform as the wavelength conversion portion;

forming the sealing portion by hardening the mixed material in the concave portion where the first wavelength conversion layer is formed; and forming a second wavelength conversion layer configured to perform as the wavelength conversion portion on the sealing portion.

11. The method of fabricating a semiconductor light-emitting apparatus according to claim 10, wherein forming the first wavelength conversion layer includes allowing the wavelength conversion material to settle out by its own weight so that the wavelength conversion material is densified in the bottom area of the concave portion.

12. The semiconductor light-emitting apparatus according to claim 1, wherein the concave portion is formed as a truncated cone.

13. The semiconductor light-emitting apparatus according to claim 1, wherein the concave portion is formed as one of an inverted pyramid, a rectangular box, and a portion of a hemisphere.

14. The semiconductor light-emitting apparatus according to claim 1, wherein the first wavelength conversion layer includes a wavelength conversion material located in a bottom portion of the sealing portion, wherein the wavelength conversion material is more dense at a location near the bottom of concave portion as compared to a location distanced from the bottom of the concave portion.

15. The semiconductor light-emitting apparatus according to claim 1, wherein the first wavelength conversion layer includes a wavelength-conversion-material-containing sheet.

16. The method of fabricating a semiconductor light-emitting apparatus according to claim 7, wherein forming the first wavelength conversion layer includes forming the first wavelength conversion layer on both the bottom surface of the concave portion and a top surface of the semiconductor light emitting device.

17. The method of fabricating a semiconductor light-emitting apparatus according to claim 7, wherein the concave portion of the base forms an opening, and forming the second wavelength conversion layer includes forming the second wavelength conversion layer such that it covers the entire opening of the concave portion.

18. A method of fabricating a semiconductor light-emitting apparatus comprising:

providing a base having a concave portion with a bottom, a pair of electrodes, a semiconductor light-emitting device located adjacent to the bottom of the concave portion and being electrically connected with the pair of electrodes, a wavelength conversion portion configured to change the wavelength of light emitted from the semiconductor light-emitting device, and a sealing portion;

loading the semiconductor light-emitting device onto the concave portion of the base so as to be electrically connected with the pair of electrodes;

injecting a mixed material into the concave portion, the mixed material being a mixture of a material for forming the sealing portion and a wavelength conversion material for forming the wavelength conversion portion;

densifying the wavelength conversion material in a bottom area of the concave portion so that a part of the bottom area of the concave portion where the wavelength conversion material is densified creates a first wavelength conversion layer configured to perform as the wavelength conversion portion;

forming the sealing portion by hardening the mixed material in the concave portion where the first wavelength conversion layer is formed; and forming a second wavelength conversion layer configured to perform as the wavelength conversion portion on the sealing portion, wherein forming the first wavelength conversion layer includes forming the first wavelength conversion layer on both the bottom surface of the concave portion and a top surface of the semiconductor light emitting device.

* * * * *